United States Patent [19]

Hayano

[11] Patent Number: 5,195,053
[45] Date of Patent: Mar. 16, 1993

[54] SEMICONDUCTOR MEMORY DEVICE WIRED TO ACCOMMODATE INCREASED CAPACITY WITHOUT INCREASING THE SIZE OF THE SEMICONDUCTOR MEMORY DEVICE

[75] Inventor: Kiminori Hayano, Tokyo, Japan

[73] Assignee: NEC Corporation, Tokyo, Japan

[21] Appl. No.: 704,916

[22] Filed: May 22, 1991

Related U.S. Application Data

[63] Continuation of Ser. No. 573,749, Aug. 28, 1990, abandoned.

[30] Foreign Application Priority Data

Aug. 30, 1989 [JP] Japan .................................. 1-223719

[51] Int. Cl.[5] .............................................. G11C 5/06
[52] U.S. Cl. ......................................... 365/51; 365/63; 257/734
[58] Field of Search ................ 365/51, 63, 230.03; 307/465.1; 357/40, 45, 46, 55

[56] References Cited

U.S. PATENT DOCUMENTS

| | | | |
|---|---|---|---|
| 4,695,978 | 10/1987 | Itakura | 365/51 |
| 4,779,227 | 10/1989 | Kurafuji et al. | 365/63 |
| 4,849,943 | 7/1989 | Pfennings | 365/230.03 |
| 4,896,302 | 1/1990 | Sato et al. | 365/51 |
| 5,007,025 | 4/1991 | Hwang et al. | 365/226 |
| 5,097,440 | 3/1992 | Konishi et al. | 365/51 |
| 5,103,282 | 4/1992 | Isomura et al. | 357/45 |

FOREIGN PATENT DOCUMENTS

| | | |
|---|---|---|
| 0201185 | 11/1986 | European Pat. Off. . |
| 0213835 | 11/1987 | European Pat. Off. . |
| 0317666 | 5/1989 | European Pat. Off. . |
| 62-0188363 | 8/1987 | Japan .................. 357/45 |
| 63-0291460 | 11/1988 | Japan .................. 357/45 |
| 0010870 | 1/1990 | Japan .................. 357/45 |

OTHER PUBLICATIONS

IEEE Journal of Solid-State Circuits, vol. 17, No. 3, Jun. 1982, New York US, pp. 459–464; Anceau et al., "Complex Integrated Circuit Design Strategy".

"Principles of CMOS VLSI Design", Oct. 1985, Addison-Wesley, Reading, US, pp. 205–211, Weste et al, "Pseudo 2-phase Memory Structures".

Primary Examiner—Joseph L. Dixon
Assistant Examiner—Jack A. Lane
Attorney, Agent, or Firm—Sughrue, Mion, Zinn, Macpeak & Seas

[57] ABSTRACT

A boundary region for wiring is provided by expanding one of a plurality of boundary regions boundary regions each being between adjacent ones of a plurality of decoder circuits included in a decoder circuit block corresponding to a memory cell array by shifting a desired portion of at least one of the decoder circuits by a desired distance and a wiring connecting wirings in the decoder circuit to a circuit provided outside the decoder circuit block is arranged in the boundary region for wiring, so that a circuit arrangement in a second region outside the decoder circuits can be made freely.

15 Claims, 7 Drawing Sheets

SEMICONDUCTOR MEMORY DEVICE WIRED TO ACCOMMODATE INCREASED CAPACITY WITHOUT INCREASING THE SIZE OF THE SEMICONDUCTOR MEMORY DEVICE

This is a continuation of application Ser. No. 07/573,749 filed Aug. 28, 1990 and now abandoned.

BACKGROUND OF THE INVENTION

The present invention relates to a semiconductor device and, particularly, to a wiring connection of a semiconductor memory device to a decoder circuit.

DESCRIPTION OF THE PRIOR ART

In general, a semiconductor memory device includes, on a chip, two regions, one being a first region formed in substantially a center portion of the chip and comprising a circuit block formed by a periodic repetition of patterns of a plurality of memory cells and a plurality of decoder circuit blocks adjacent thereto and the other being a second region arranged outside the first region and in which circuits such as a redundancy circuit and an address generator circuit are formed.

In such a semiconductor memory device as above, address signal lines which are common to the respective decoder circuit blocks are arranged so as to traverse the respective decoder circuit blocks. Among circuits arranged in the second region of the semiconductor memory device, however, circuits such as the redundancy circuit and the address generator circuit which receive and provide address signals must be connected to address signal lines. That is, wirings from these circuits in the second region must be connected to the address lines.

In a conventional memory device, a space existing between these two adjacent memory regions is utilized as a wiring region from the circuits in the second region to the address signal lines. That is, since such space is also present in-between corresponding decoder circuit blocks in a respective memory cell region, signal lines corresponding in number to the address signal lines are arranged in this space for connection to the address signal lines.

Since, however, a location of the space is determined by an arrangement of the memory cell regions, locations of circuits such as the redundancy circuit are restricted thereby, resulting in the freedom of circuit arrangement in the second region being reduced.

Further, the recent tendency towards increased memory capacity of a semiconductor memory device requires a space which is large enough to arrange therein wires corresponding in number to address lines which is increased in number due to the increased memory capacity, resulting in a necessity of increasing chip area.

BRIEF SUMMARY OF THE INVENTION

Objects of the Invention

Therefore, a first object of the present invention is to provide a semiconductor memory device having a second region thereof in which circuit arrangement can be done freely.

A second object of the present invention is to provide a semiconductor memory device whose chip area is not increased even if the number of address lines is increased.

SUMMARY OF THE INVENTION

A semiconductor memory device according to the present invention features a boundary region for wiring set in one of a plurality of boundary regions existing in-between a plurality of respective decoder circuits in a decoder circuit block corresponding to a memory cell array, by shifting a predetermined portion of at least one of the decoder circuits by an arbitrary distance and furthermore, wires connecting wires in the decoder circuit to circuits provided outside of the decoder circuit block are arranged in the boundary region for wiring.

In a preferred embodiment of the present invention, a plurality of address signal lines are formed in an upper wiring layer, the plurality of decoder circuits are formed by circuit elements interconnected by a wiring layer in a lower level than the address signal lines and arranged with the same pattern as that of the decoder circuits. A first boundary region of a predetermined width is provided between one decoder circuit pattern and another decoder circuit pattern adjacent to one side of the one decoder circuit pattern, a wider, second boundary region is provided between the one decoder circuit pattern and another decoder circuit pattern adjacent to the other side of the another decoder circuit pattern and wires connecting the address wirings to peripheral circuits are provided in the second boundary region in a level lower than the address wiring level.

BRIEF DESCRIPTION OF THE DRAWINGS

The above-mentioned and other objects, features and advantages of this invention will become apparent by reference to the following detailed description of the present invention in conjunction with the accompanying drawings, where.

DETAILED DESCRIPTION OF THE INVENTION

Before describing embodiments of the present invention, a conventional semiconductor memory device will be described.

Figure 1:
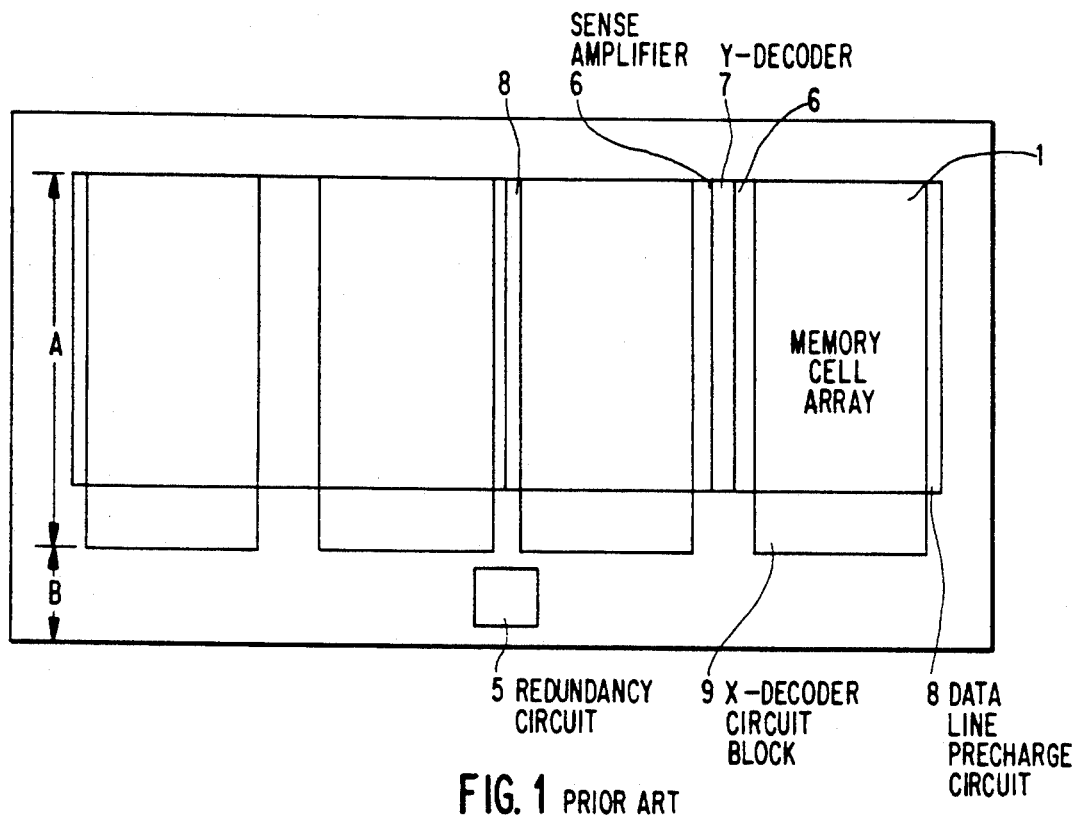
FIG. 1 shows a general construction of a conventional semiconductor memory device.

FIG. 1 shows a general construction of a DRAM (dynamic random access memory) of 1 M bits. In general, the semiconductor memory device has a first region A arranged in substantially the center of a chip thereof, in which a plurality (in FIG. 1, four) of memory cell arrays 1 are arranged. Adjacent to each of the memory cell arrays 1, circuit blocks are provided each having a regular repetition of patterns of circuits such as an X decoder circuit block 9, a Y decoder circuit block 7, a sense amplifier circuit 6 in which a number of sense amplifiers are formed and data line precharge circuit 8, etc.

On the other hand, in a second region B defined in a peripheral portion of the chip, a control signal generator circuit, a data input/output circuit and electrode pads, etc., all of which are not shown, are formed in addition to a redundancy circuit 5 and an address generator circuit (not shown), etc.

Figure 2:
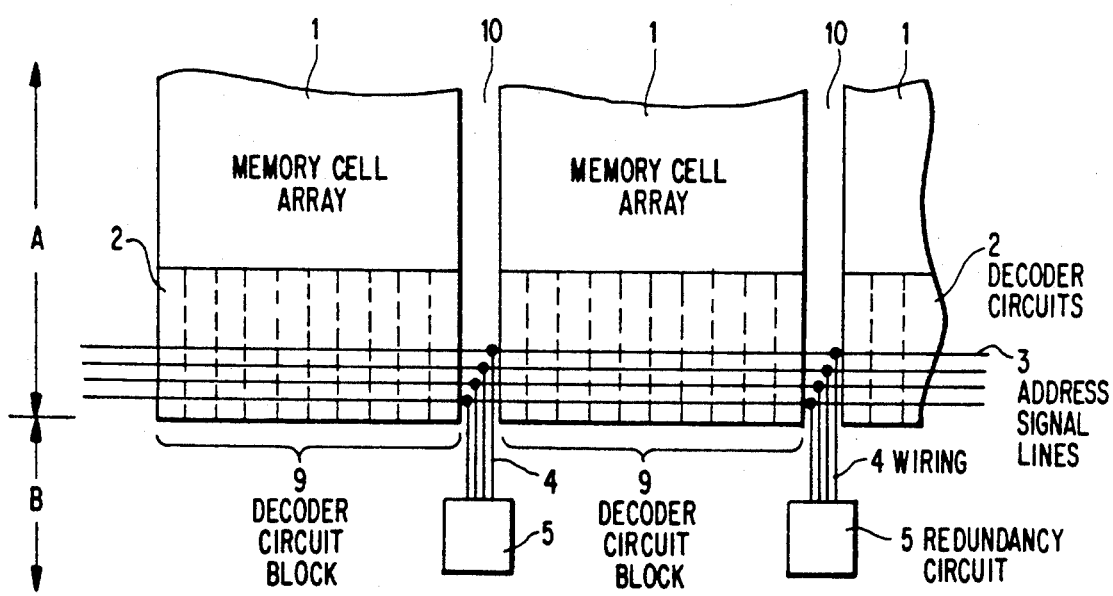
FIG. 2 shows a construction of a conventional X decoder circuit and other circuits associated therewith.

FIG. 2 shows constructions of the X decoder circuit blocks 9 of the semiconductor memory device and other circuits associated therewith. Each X decoder circuit block 9 is constituted with a plurality of decoder circuits 2 having identical constructions and arranged equidistantly. Address signal lines 3 which are common to the respective decoder circuits 2 are formed in an upper aluminum wiring layer traversing the respective decoder circuits 2 of the respective X decoder circuit blocks 9.

Among the circuits arranged in the second region B, such circuits as the redundancy circuit 5 and the address signal generator circuit which are required to receive address signals and output them must be connected to the address signal lines 3. Therefore, wirings 4 extending from each of the redundancy circuits 5 to the address signal lines 3 are provided. The wirings 4 are provided in a high melting point metal layer disposed below the address signal lines 3 and connected thereto. Since, however, there are wirings in the decoders 2, which are formed in the same step as that for forming the wirings 4, it is impossible to arrange the wirings 4 in the decoder circuits 2. Although there is provided a small boundary region between adjacent decoder circuits 2, it does not have a width large enough to accept the wirings 4 therein.

Figure 3:
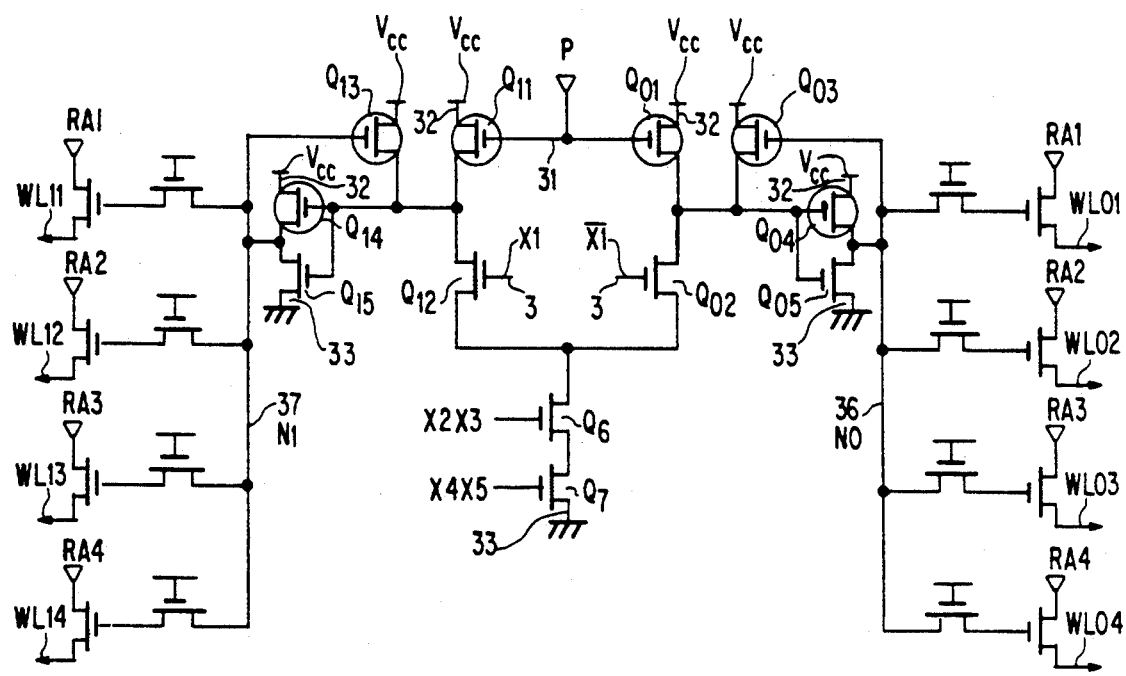
FIG. 3 shows constructions of conventional decoder circuits.

This will be described in more detail with reference to FIGS. 3, 4 and 5. FIG. 3 shows a circuit construction of each of the decoder circuits 2 shown in FIG. 2. Address signals $\overline{X1}$ and X1 supplied from the address signal lines 3 are supplied to gates of N channel MOS transistors Q02 and Q12, respectively. Logical product signals X2X3 and X4X5 of address signals produced by circuits not shown are supplied to gates of a pair of series connected N channel MOS transistors Q6 and Q7 having one end connected to GND (ground potential) through an aluminum wire 33, respectively. A precharge signal P supplied from an aluminum wire 31 is supplied to gates of P channel MOS transistors Q01 and Q11 having source supplied with a source voltage Vcc through an aluminum wire 32. A NAND gate is constructed with these transistors.

A pair of outputs of this NAND gate are supplied to respective input portions of an inverter constituted with the series connection of the P channel MOS transistor Q04 having source supplied with the source voltage Vcc from the aluminum wiring 32 and the N channel MOS transistor Q05 having the source connected to GND through the aluminum wiring 33 and an inverter constituted with similar transistors Q14 and Q15 and outputs N0 and N1 are derived from output lines 36 and 37 thereof, respectively. In response to these outputs N0 and N1, one of word line drive signals RA1 to RA4 appears on one of eight word lines WL01 to WL04 and WL11 to WL14 as a word drive signal for the memory cell array 1.

Figure 4:
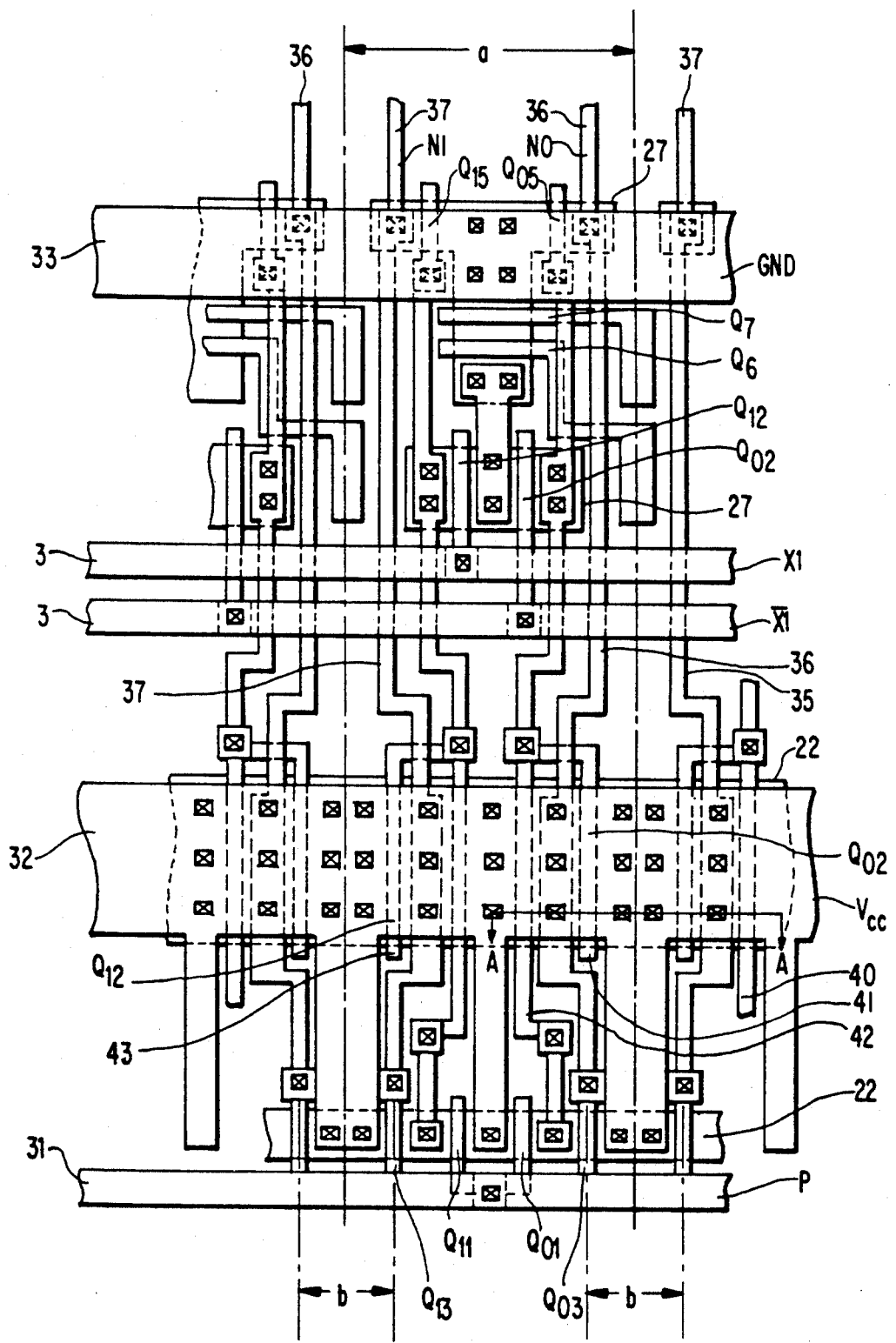
FIG. 4 shows a pattern portion of a conventional decoder circuit corresponding to a NAND circuit and an inverter circuit thereof.

FIG. 4 shows a pattern of a portion of the decoder circuit shown in FIG. 3 corresponding to the NAND circuit and the inverter circuit. In FIG. 4, portions in which the transistors of the circuit in FIG. 3 are formed are depicted by the same reference numerals. Further, wiring layers for signals in FIG. 4 are depicted by the same reference numerals as those used in FIG. 3. There is a region having width a in which a decoder circuit is formed. The value a depends upon the kind of decoder circuit and it is about 28 um in this example.

In order to form this decoder circuit, signal lines such as the address lines 3, Vcc lines 32, GND lines 33 and precharge lines 31, etc., which are common to the respective decoder circuits are formed by an upper aluminum wiring layer extending over the decoders in the direction traversing them. Below the aluminum wiring layer, polysilicon layer 40 to 43 used as gate electrodes of for instance the P channel MOS transistors Q01 and Q11 and the N channel MOS transistors Q02 and Q12 as well as a high melting point metal wiring used as wirings of the inverter outputs N0 and N1 exist.

Therefore, it is impossible to arrange the wirings 4 provided in the high melting point metal layer within the decoder circuit block 2.

The decoder circuits 2 having identical construction and each arranged in the region having width a shown in FIG. 4 are disposed in the decoder circuit block 9 shown in FIG. 2. Generally, in order to avoid any interference with adjacent circuits, edge portions of the decoder pattern are bounded by regions in which no high melting point metal wiring, etc., is provided. Therefore, there is provided a boundary region b between the adjacent decoder circuits 2. In this example, the value b is about 10 µm. In this pattern construction of decoder circuits, it is difficult to arrange high melting point metal wiring in the region having width b because contact holes may be provided in this region. Therefore, it is impossible to arrange the wiring 4 extending from the redundancy circuit 5 to the address signal lines 3 in the region b between the adjacent decoder circuit blocks 2.

Figure 5:
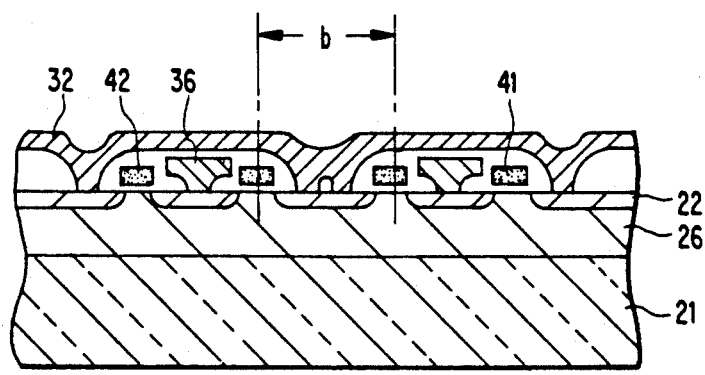
FIG. 5 is a cross section taken along a line A—A in FIG. 4.

FIG. 5 is a cross section taken along a line A—A in FIG. 4. In the boundary region b, there is no room for other wirings in a region between the aluminum wiring 32 for supplying the source voltage Vcc and an N type impurity region 26, that is, in a layer which is in the same level as that of the high melting point metal wiring 36 as well as the polysilicon layer used as the gate of the transistor Q04.

As mentioned, in the conventional semiconductor memory device, it is impossible to arrange, within the decoder circuit block 9 including the plurality of decoder circuits 2, the wirings 4 interconnecting the address signal lines 3 and the circuits such as the redundancy circuit 5, etc., arranged in the second region B.

Such wiring as the wirings 4 connecting the address signal lines 3 to the redundancy circuit 5 have been arranged in a space 10 between adjacent decoder circuit blocks 9, as shown in FIG. 2. The space 10 is provided due to the fact that, since, as mentioned previously, the Y decoder circuit block and the sense amplifier circuit block are provided between the respective memory cell arrays 1, there is provided a space between the X decoder circuit blocks 9 provided correspondingly to the respective memory cell arrays 1.

Since, however, the region in which the wirings 4 from the address signal lines 3 to where the redundancy circuit 5 is disposed is determined by a location of the space between the decoder circuit blocks 9 in the conventional semiconductor memory device, the redundancy circuit, etc., should be arranged near the space when resistance, etc., of the wiring is considered. That is, the freedom of arrangement of the circuits in this second region B is restricted.

Furthermore, since the number of address lines is increased recently due to the increased capacity of the semiconductor memory device, the space necessary to arrange the wirings 4 corresponding in number to all address lines must be large, resulting in an increased chip area.

As embodiment of the present invention will be described with reference to FIGS. 6 to 11.

Figure 6:
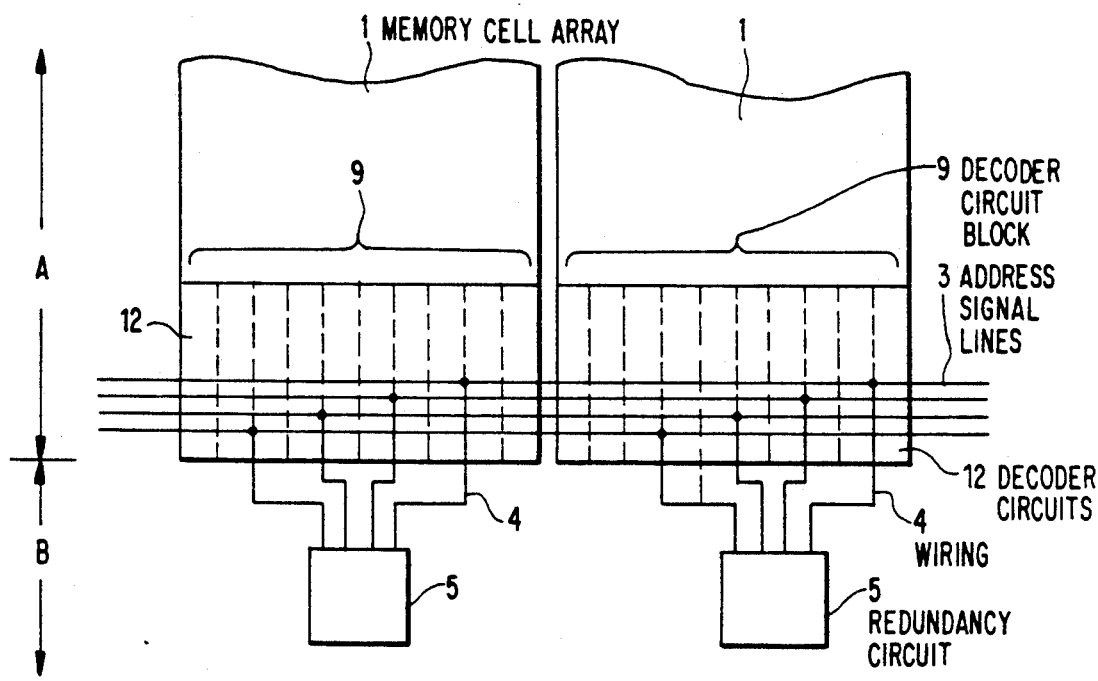
FIG. 6 shows a first embodiment of a semiconductor memory device according to the present invention.

FIG. 6 shows the construction of X decoder circuit blocks 9 of a semiconductor memory device according to a first embodiment of the present invention and its peripheral portion. In this embodiment, an arrangement of wirings 4 connecting address signal lines and a redundancy circuit will be described.

The X decoder circuit block 9 is constituted with a plurality of decoder circuits 12. Each of the decoder circuits 12 has an identical construction to that of the decoder circuit 2 in FIG. 3. The address signal lines 3 are formed in an upper aluminum layer and extend over the respective decoder circuits 12 in directions traversing them. In this embodiment, the wirings 4 connecting the address signal lines 3 and the redundancy circuit 5 are arranged in a boundary region between adjacent ones of the decoder circuits 12. In order to obtain a width of the boundary region large enough to receive the wiring 4, a portion of the region occupied by a predetermined decoder circuit 12 is shifted. This will be described in more detail with reference to FIGS. 7 and 8.

Figure 7:
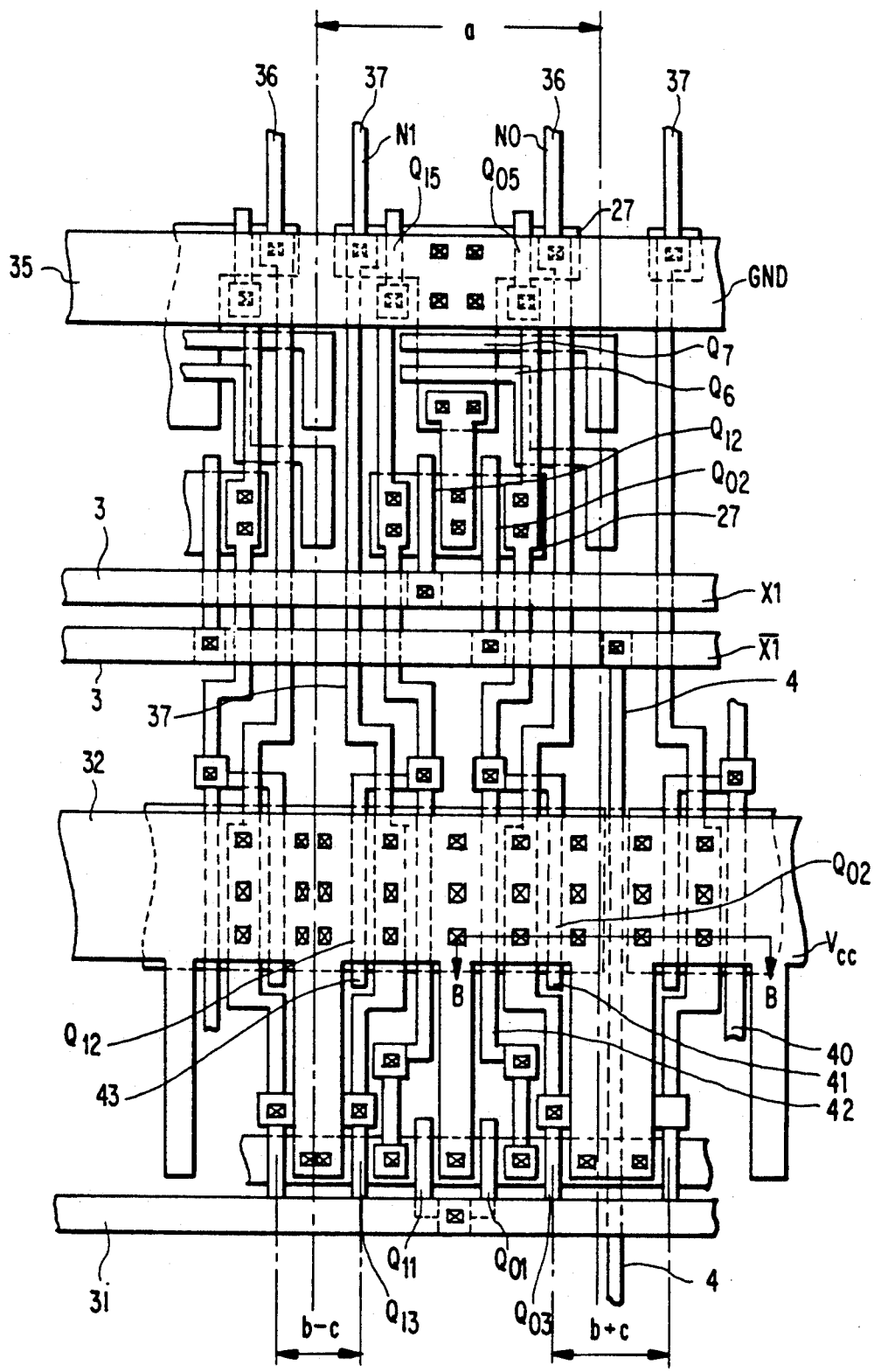
FIG. 7 shows a pattern of a portion of the decoder circuit of the semiconductor memory device shown in FIG. 6 corresponding to a NAND circuit and an inverter circuit thereof.
Figure 9:
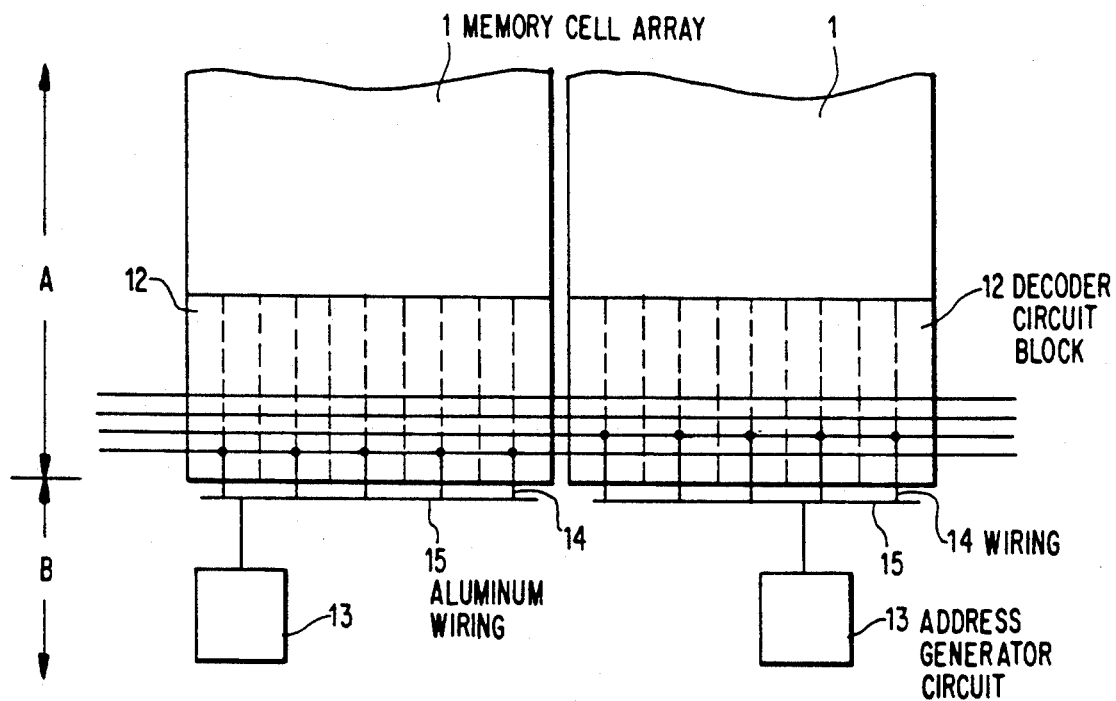
FIG. 9 shows a second embodiment of the semiconductor memory device according to the present invention.
Figure 10:
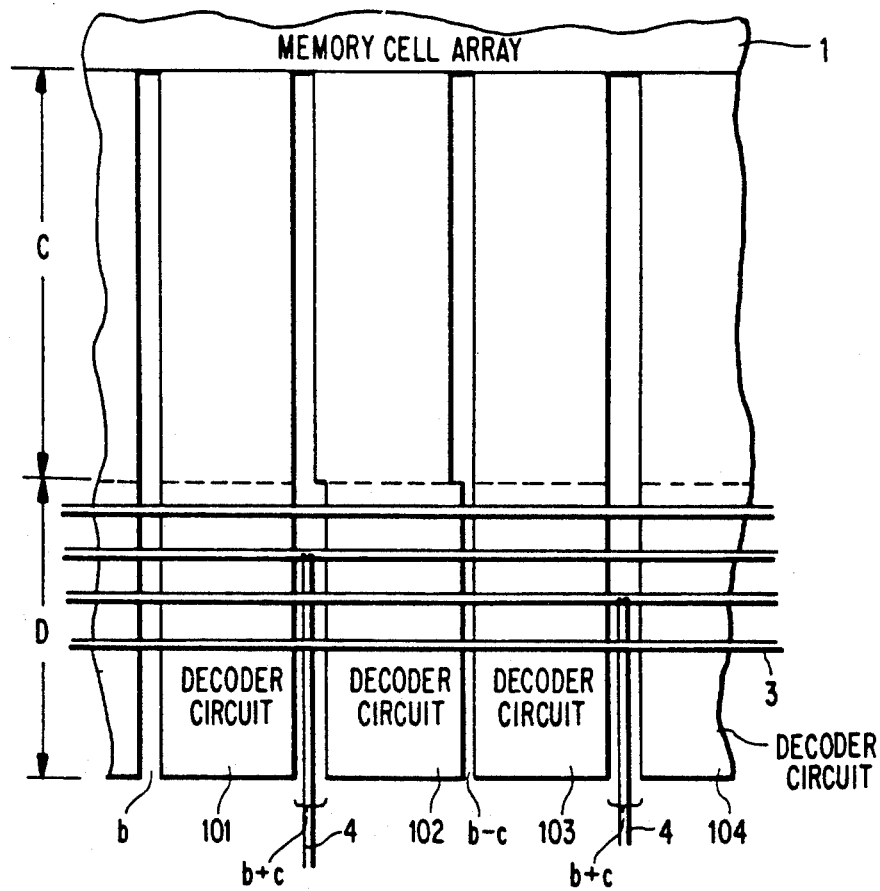
FIG. 10 shows a third embodiment of the semiconductor memory device according to the present invention.

FIG. 7 shows a pattern construction of one of the decoder circuits 12 which is adjacent to the boundary region in which a wirings 4 is arranged. In this figure, corresponding portions to those shown in FIG. 4 are depicted by same reference numerals, respectively.

A region in which one decoder circuit is formed exists in a width a in FIG. 7. In this example, the decoder has an identical circuit construction to the circuit shown in FIG. 3 and a circuit pattern which is basically the same as that shown in FIG. 4.

As mentioned previously, there is the empty region in the side edge portions of the decoder circuit pattern, in which no high melting point metal wiring is provided to avoid the undesired effect on the adjacent circuits. The inventors of this application have found that there is substantially no problem even if this empty region becomes somewhat narrower, since the width of this empty region is designed with considerable tolerance. In this embodiment, the decoder circuit at a center is shifted leftwardly by a distance c without changing its pattern such that the empty regions of the center decoder circuit and another adjacent decoder circuit disposed in a left side of the center decoder are partially overlapped, as shown in FIG. 7. With this leftward shift of the center decoder circuit, the width of a boundary region between these two decoder circuits becomes b-c. In this example, it has been found that the value c of about 3 $\mu$m provides no problem.

With such leftward shift of the center decoder circuit by c, the width of the boundary region between the center and the right side decoders becomes b+c, i.e., about 13 $\mu$m.

With the increase of boundary region width by c, it becomes possible to arrange in this boundary region the high melting point metal wirings 4 in a lower level than that of the aluminum wirings 31 and 32. As a result, one wiring 4 supplying an address signal X1 from the address signal line 3 to the redundancy circuit 5 is arranged in this boundary region.

Figure 8:
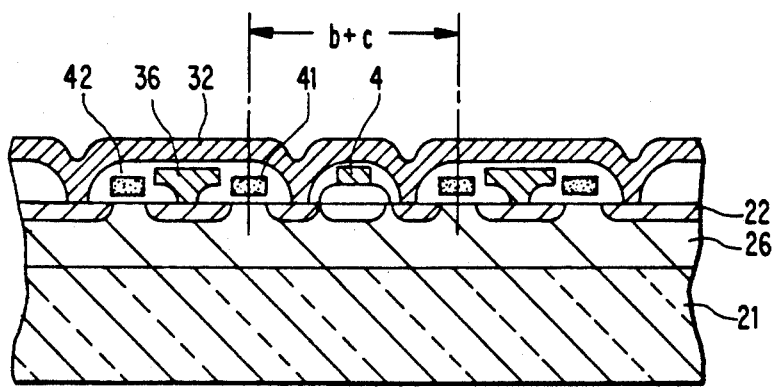
FIG. 8 is a cross section taken along a line B—B in FIG. 7.

FIG. 8 is a cross section taken along a line B—B in FIG. 7. With the width of the boundary region being b+c, it becomes possible to arrange one wiring 4 in a level between the aluminum wiring 32 for supplying the source voltage Vcc and the N type impurity region 26, through the same step as that of forming the high melting point metal wiring 36.

Returning to FIG. 6, this embodiment will be described in more detail.

As mentioned it is possible to arrange the wiring 4 in the widened boundary region provided by shifting a portion of a predetermined decoder circuit 12. Thus, by shifting decoder circuits arbitrarily selected from the plurality of decoder circuits 12 included in the decoder circuit block 9, it is possible to provide a plurality of boundary regions in each of which the wiring 4 can be arranged. That is, it is possible to arrange the wirings 4 corresponding in number to the address signal lines 3 in arbitrary positions within the decoder circuit block 9. Therefore, the position of the redundancy circuit 5 in the second region B can be freely determined. As a result, the freedom of positional selection of the redundancy circuit and the electrode pads in the second region B is increased since it is possible to determine positions of the redundancy circuit and the electrode pads in the second region B without interfering with each other.

Further, the wirings 4 corresponding in number to the address signal lines can be arranged in the decoder circuit block 9 even when the number of the address signal lines is increased with the increase in the capacity of the semiconductor memory device, and, therefore, the wirings 4 are not required to be located in a limited area. Since, therefore, there is no need to make the space between the adjacent decoder circuit blocks 9 larger as required in the conventional device, an increase in chip area can be avoided.

As mentioned previously, among the circuits arranged in the second region B, the address signal generator circuit should be also connected to the address signal lines 3. Another embodiment of the present invention will be described with reference to FIG. 9 as a second embodiment, in which wirings 14 for connecting the address signal lines 3 to the address generator circuit 13 are arranged.

An X decoder circuit block 9 is constituted with a plurality of decoder circuits 12. Each decoder circuit has an identical construction to that of the decoder circuit 12 mentioned in the first embodiment. The address signal lines 3 are provided by an aluminum wiring extending over the respective decoder circuits 12 in a direction traversing them. In order to supply an address signal from the address generator circuit 13 to one of the address signal lines 3, a plurality of parallel wirings 14 are arranged between the address signal lines 3 and an aluminum wiring 15 connected to the address generator circuit. The respective wirings 14 are arranged in a plurality of boundary regions existing between adjacent ones of the decoder circuits 12.

The enlargement of width of the boundary region for arrangement of the wiring 14 can be achieved in the same way as in the first embodiment and the pattern construction of the decoder circuit 12 to be shifted by a distance c is also the same as that of the first embodiment. Therefore, details thereof are omitted.

The reason why the plurality of parallel wirings 14 are arranged between the address signal lines 3 and the aluminum wiring 15 and the effect obtainable thereby will now be described. That is, when it is desired to arrange a number of wirings in a narrow region such as the space 10 existing between the adjacent decoder circuit blocks 9, the width of each wiring must be reduced, which causes the resistance value of the wiring to be increased considerably, resulting in delay of address signal transmission. In this embodiment, however, there is substantially no delay of address signal transmission since the resistance of the wiring is reduced due to the parallel connection of the plural wirings 14, even if each wiring 14 has a large resistance value.

Now, which portion of the decoder circuit is to be shifted will be described. In the first and second embodiments, the shift of the decoder circuit has been described only for the pattern construction portion (FIGS. 4 and 7) of the portion corresponding to the NAND circuit and the inverter circuit among the decoder 2 or 12. However, in the present invention, it is possible to shift a portion of the portion constituting one decoder circuit or a whole decoder circuit to expand the boundary region. This will be described with reference to FIG. 10.

For the case where the boundary region is to be expanded by shifting a portion of a decoder circuit, a region D of a decoder circuit 102 is shifted rightwardly by a distance c. Thus, the width of the boundary region becomes b+c making an arrangement of the wiring 4 therein possible. The region D is not always the portion corresponding to the NAND circuit and the inverter circuit shown in FIG. 4 or 7. That is, it is enough for the wider boundary region that it exists in an area between a cross point of the address signal line 3 and the wiring 4 and the redundancy circuit. In the case shown in FIG. 10, a region D of the decoder circuit 102 is stepped by c with respect to a region C thereof. Therefore, the wiring pattern of this stepped portion is modified by adding a lateral wiring to each of the internal wirings which are disconnected by this shift.

Now, an example where a whole decoder circuit is shifted to expand the boundary region will be described. By shifting a whole decoder circuit 104 rightwardly by c, the width of the boundary region between decoders 103 and 104 becomes b+c, so that it is possible to arrange a wiring 4 in this region. According to this example, it is possible to expand the boundary region without modifying the internal wiring pattern of the decoder circuit.

Figure 11:
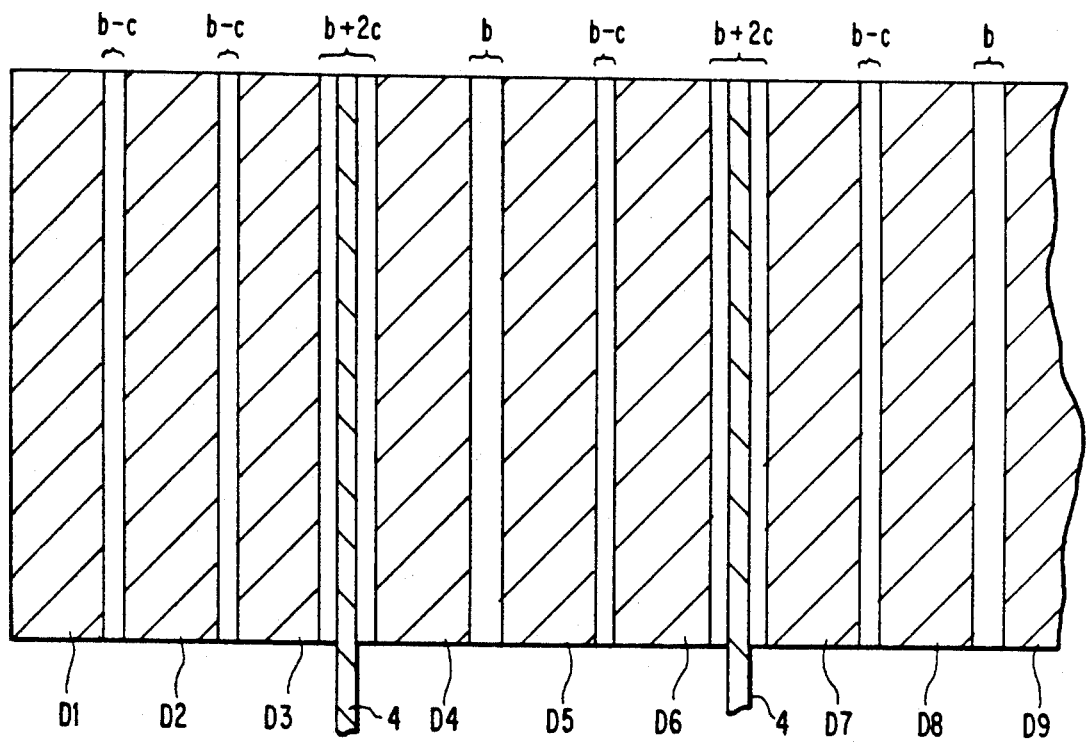
FIG. 11 shows a fourth embodiment of the semiconductor memory device according to the present invention.

Although, in the above-mentioned example in which one decoder circuit is shifted by c to make the width of the boundary region b+c, there may be a case where it is impossible to arrange a wiring 4 within the region b+c, depending upon values of b and c and/or the kind of wiring. Further, there may be a case where a plurality of wirings 4 should be arranged within the boundary region. In order to solve these problems, the width of the boundary region should be expanded further. FIG. 11 shows another embodiment of the present invention by which such further expansion of the boundary region is realized.

When the width of the boundary region is to be made b+2c, a decoder circuit D2 is shifted first leftwardly by c to make the width of a boundary region between decoder circuits D1 and D2 b−c and a decoder circuit D3 is also shifted leftwardly by c to make the width of a boundary region between the decoder circuits D2 and D3 b−c. Therefore, the width of a boundary region between the decoder circuits D3 and D4 becomes b+2c. That is, by shifting a plurality of decoder circuits in the same direction, a boundary region having any desired width can be provided.

Alternatively, a decoder circuit D6 is shifted leftwardly by c to make the width of boundary region between a decoder circuit D5 and the decoder circuit D6 b−c and a decoder circuit D7 is shifted rightwardly by c to make the width of boundary region between the decoder circuit D7 and a decoder circuit D8 b−c. Therefore, the width of boundary region between the decoder circuits D6 and D7 becomes b+2c.

That is, such further expansion of the boundary region can be realized by shifting a plurality of decoder circuits in the same direction or shifting adjacent decoder circuits the width of boundary region between which it is to be expanded in opposite directions.

Although, in either example mentioned above, the width of the boundary region is made b+2c by moving two decoder circuits, any width expansion a boundary region between adjacent decoder circuits can be done by increasing the number of decoder circuits to be shifted. In a case where a plurality of decoder circuits are shifted, the shifting amount of each decoder circuit is not limited to c. That is, these decoder circuits can be shifted by any desired distances, respectively.

Although the present invention has been described with respect to a DRAM as the memory cell array 1, the present invention is not limited thereto and equally applicable to any memory such as static RAM (SRAM). Although, in such case, the kind of decoder depends upon the kind of memory, the present invention can be used for any decoder circuit. Therefore, the decoder circuit shown in FIG. 3 and the pattern constructions shown in FIGS. 4 and 7 are mere examples.

Further, although the present invention has been described with reference to the X decoder circuit block 9, the present invention is equally applicable to the Y decoder circuit block 7.

Further, it should be noted that the signal lines connected to the second region B are not always the address signal lines 3. That is, these signal lines may be any lines provided that they must be connected to the circuit in the second region B. For example, they may be signal lines for a control signal, such as precharge signal, of a decoder circuit.

The circuits existing in the second region B and connected by the wirings 4 are not limited to the redundancy circuit and address generator circuit. For example, it may be a control signal generator circuit for the decoder.

Although the wiring 4 has been described as having high melting point metal, any of aluminum, silicide and polycrystal silicon may be used therefor.

Further, although the wiring 4 is single layered in FIG. 8, it is possible to make it multilayered so that the number of wirings in the expanded boundary region can be increased.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device including at least one memory cell array formed on a semiconductor substrate, said semiconductor memory device comprising:
    a decoder circuit block being provided for each of said at least one memory cell array, wherein said decoder circuit block includes a plurality of decoder circuits;
    a plurality of address signal lines extending over said plurality of decoder circuits in a direction traversing said plurality of decoder circuits;
    said plurality of decoder circuits each being constituted by an identical arrangement of circuit elements where said plurality of decoder circuits are interconnected by a wiring layer arranged below a wiring layer of said plurality of address signal lines;
    a peripheral circuit arranged independently of said decoder circuit block in said semiconductor memory device in said layer below said plurality of address signal lines;
    a first boundary region having a predetermined width defined between two opposing sides of a first and a second decoder circuit;
    a second boundary region having a predetermined width greater than said predetermined width of said first boundary region, said second boundary region being defined by an outer side of said first decoder circuit which is parallel to the side of said first decoder circuit opposing said second decoder circuit and an opposing side of a third decoder circuit; and
    wiring for connecting said plurality of address signal lines of said decoder circuit block to said peripheral circuit, said wiring being arranged in said second boundary region in said layer below said plurality of address signal lines.

2. The semiconductor memory device claimed in claim 1, wherein said second boundary region is formed by shifting a portion of at least one of said plurality of decoder circuits a predetermined distance in a horizontal direction.

3. The semiconductor memory device claimed in claim 1, wherein said second boundary region is formed by shifting at least one of said plurality of said decoder circuits a predetermined distance in a horizontal direction.

4. The semiconductor memory device claimed in claim 1, wherein a plurality of boundary regions are provided in said decoder circuit block by shifting a plurality of said plurality of decoder circuits a predetermined distance in a horizontal direction where each of said plurality of boundary regions has a width wider than said first boundary region.

5. The semiconductor memory device claimed in claim 1, wherein said wiring corresponds in number to said plurality of address signal lines in said decoder circuit block.

6. The semiconductor memory device claimed in claim 4, wherein said wiring is provided in said plurality of boundary regions.

7. The semiconductor memory device claimed in claim 6, wherein said wiring in said plurality of boundary regions is connected in parallel to one of said address signal lines of said decoder circuit block.

8. The semiconductor memory device claimed in claim 1, wherein said peripheral circuit is a redundancy circuit.

9. The semiconductor memory device claimed in claim 1, wherein said peripheral circuit is an address generator circuit.

10. The semiconductor memory device claimed in claim 1, wherein said peripheral circuit is a control signal generator circuit.

11. The semiconductor memory device claimed in claim 1, wherein said at least one memory cell array is a DRAM.

12. The semiconductor memory device claimed in claim 1, wherein said at least one memory cell array is a SRAM.

13. The semiconductor memory device claimed in claim 1, wherein said plurality of decoder circuits are row decoders.

14. The semiconductor memory device claimed in claim 1, wherein said plurality of decoder circuits are column decoders.

15. The semiconductor memory device claimed in claim 1, wherein said wiring is a multi-layered wiring.

* * * * *